(12) United States Patent
Lee

(10) Patent No.: US 6,461,903 B2
(45) Date of Patent: Oct. 8, 2002

(54) METHOD FOR FABRICATING A PART DEPLETION TYPE SOI DEVICE PREVENTING A FLOATING BODY EFFECT

(75) Inventor: Jong Wook Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/874,293

(22) Filed: Jun. 6, 2001

(65) Prior Publication Data

US 2002/0034841 A1 Mar. 21, 2002

(30) Foreign Application Priority Data

Jun. 28, 2000 (KR) .......................................... 2000-36132

(51) Int. Cl.[7] .............................................. H01L 21/84
(52) U.S. Cl. ...................... 438/164; 438/149; 438/151; 438/197; 438/294
(58) Field of Search ................ 438/149, 151, 438/164, 197, 294

(56) References Cited

U.S. PATENT DOCUMENTS

| 5,405,795 | A | * | 4/1995 | Beyer et al. | 148/DIG. 150 |
| 5,726,081 | A | * | 3/1998 | Lin et al. | 438/163 |
| 5,923,980 | A | * | 7/1999 | Gardner et al. | 257/262 |
| 6,048,756 | A | * | 4/2000 | Lee et al. | 438/151 |
| 6,110,769 | A | * | 8/2000 | Son | 438/164 |
| 6,365,445 | B1 | * | 4/2002 | Yu | 257/347 |
| 6,376,285 | B1 | * | 4/2002 | Joyner et al. | 205/656 |

* cited by examiner

Primary Examiner—Eddie Lee
Assistant Examiner—N. Drew Richards
(74) Attorney, Agent, or Firm—Finnegan, Henderson, Farabow, Garrett & Dunner, L.L.P.

(57) ABSTRACT

Disclosed is a part depletion type SOI device capable of preventing a floating body effect and a method for fabricating the same. The part depletion type SOI device comprises physical isolated spaces on boundaries between a channel region and source/drain regions.

4 Claims, 5 Drawing Sheets

METHOD FOR FABRICATING A PART DEPLETION TYPE SOI DEVICE PREVENTING A FLOATING BODY EFFECT

BACKGROUND OF THE INVENTION

1. Field of the Invention

This invention relates to a method for fabricating a SOI device, and more particularly to a method for fabricating a part depletion type SOI device capable of preventing mis-operation of a circuit due to a floating body effect.

2. Description of the Related Art

With high performance of semiconductor devices, the semiconductor integration technology using SOI wafer having a stack structure of a buried oxide film sandwiched between a base substrate and a semiconductor layer instead of single crystal silicon wafer being comprised of a bulk silicon has been proposed. It is because the devices fabricated into the SOI wafer have advantages of high speed due to a low junction capacitance and latch-up reduction due to a complete device isolation as compared with those fabricated in the single crystal silicon wafer.

The SOI devices are classified into a full depletion type device and a part depletion type device according to the thickness of the semiconductor layer.

In the full depletion type devices, the body of transistor, that is, the part of the semiconductor layer that the channel is to be formed, is thicker than the field oxide film. However, in the part depletion type device, the body of transistor is as thick as the field oxide film.

In the part depletion type SOI device, since the body of a transistor is fully isolated by the field oxide film and buried oxide film, mis-operation is generated by a floating body effect. Accordingly, the operation performance becomes unstable.

In more detail, as shown in FIG. 1, the part depletion type SOI device has the structure that the body of a transistor, that is, the semiconductor layer 3 where the channel is to be formed, is fully isolated by a buried oxide film 2 and a field oxide film 4. In the structure, a hole generated by impact ionization due to high electric field in the drain region 8 is accumulated on the neutral layer of source region 7 having the lowest energy, that is, a boundary with channel region 3. However, the hole accumulated on the neutral layer of the source region 7 decreases the threshold voltage and generates kink phenomenon that is an instantaneous increase of drain electric current by turning on the PN junction interposed between the channel region 3 and the source region 7. Accordingly, the part depletion type SOI devices have unstable operation performance by a parasitic bipolar transistor and the floating body effect such as the kink phenomenon. Therefore, in order to ensure a stable operation performance, it is required to remove the floating body effect.

In the FIG. 1, reference numeral 1 denotes a base substrate, reference numeral 5 denotes a gate insulating film, and reference numeral 6 denotes a gate electrode.

SUMMARY OF THE INVENTION

Accordingly, it is an object of the present invention to provide a method for fabricating part depletion type SOI devices capable of removing the floating body effect.

According to an aspect of the present invention, there is provided to a method for fabricating a SOI device comprising: preparing a SOI wafer having a stack structure of a base substrate, a buried oxide film, and a semiconductor layer; forming a field oxide film on the semiconductor layer to define an active region; forming a gate on the active region of the semiconductor layer; forming a dummy spacer on the gate and both side walls thereof; forming a polycrystalline silicon film at a selected width on the both sides of gate including the dummy spacer; depositing an insulating film over the resultant structure; polishing the insulating film using a dummy spacer as a polishing stop layer; removing the polycrystalline silicon layer to expose a part of the semiconductor layer; forming a hole exposing a part of the buried oxide film by dry etching the exposed part of the semiconductor layer; etching the buried oxide film exposed through the hole and the area adjacent thereto using a wet etching process; growing a silicon epitaxial layer from the midpoint of the semiconductor layer to the point higher than the upper surface of the semiconductor layer on the side of the semiconductor layer exposed through the hole using the selective epitaxial growth process; etching the surface of the silicon epitaxial layer to be equivalent to the height of the semiconductor layer; removing the dummy spacer and the insulating film; and forming source/drain regions of LDD structure having the physical isolation space on the boundaries between source/drain regions and a channel region in the active region of the exposed semiconductor layer.

The above objects and other features and advantages of the present invention will become more apparent in light of the following detailed description and the accompanying figures.

DETAILED DESCRIPTION OF THE INVENTION

A method for fabricating SOI devices according to the preferred embodiment of the present invention will be described in more detail with reference to the accompanying figures.

Figure 1:
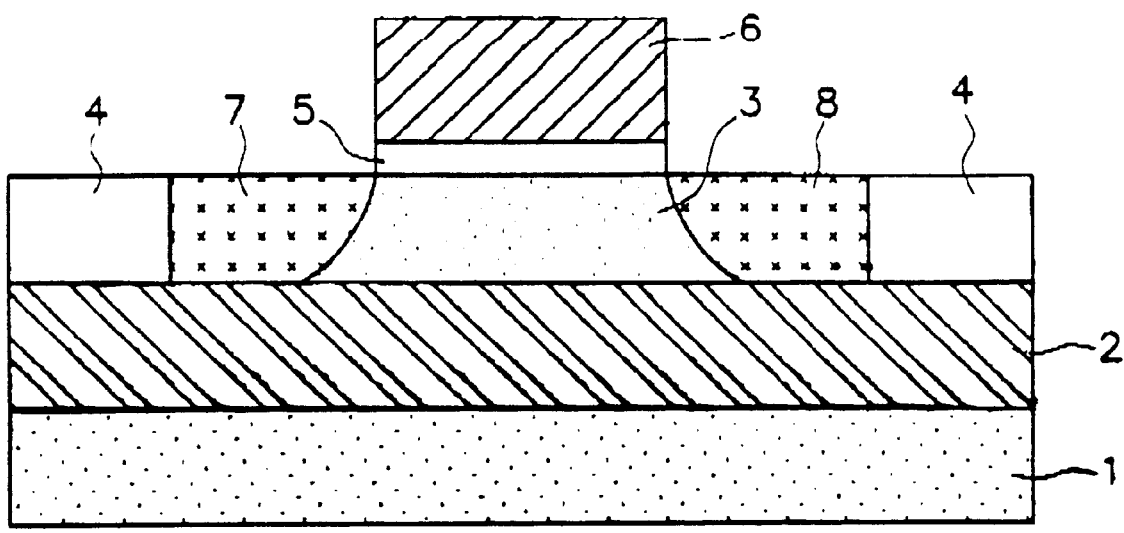
FIG. 1 is a sectional view of a part depletion type SOI device in the prior art.
Figure 2A:
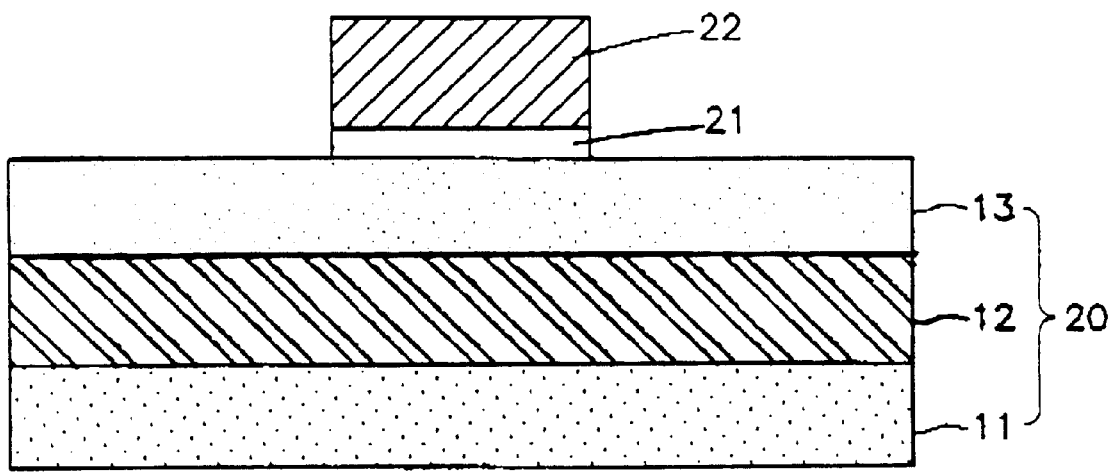
FIGS. 2A, 2B, 2C, 2D, 2E, 2F, 2G, and 2H are sectional views of a part depletion type SOI device in accordance with a preferred embodiment of the present invention.

Referring to FIG. 2A, there is provided a SOI wafer 20 having a stacked layer comprising a base substrate 11, a buried oxide film 12, and semiconductor layer 13. A field oxide film (not shown) is formed on a selected part of the semiconductor layer to define an active region. The field oxide film is formed by the depth to be contacted with the buried oxide film 12. A gate 22 having a gate oxide film 21 is formed on the active region of the semiconductor layer 13 in accordance with the well-known process.

Figure 2B:
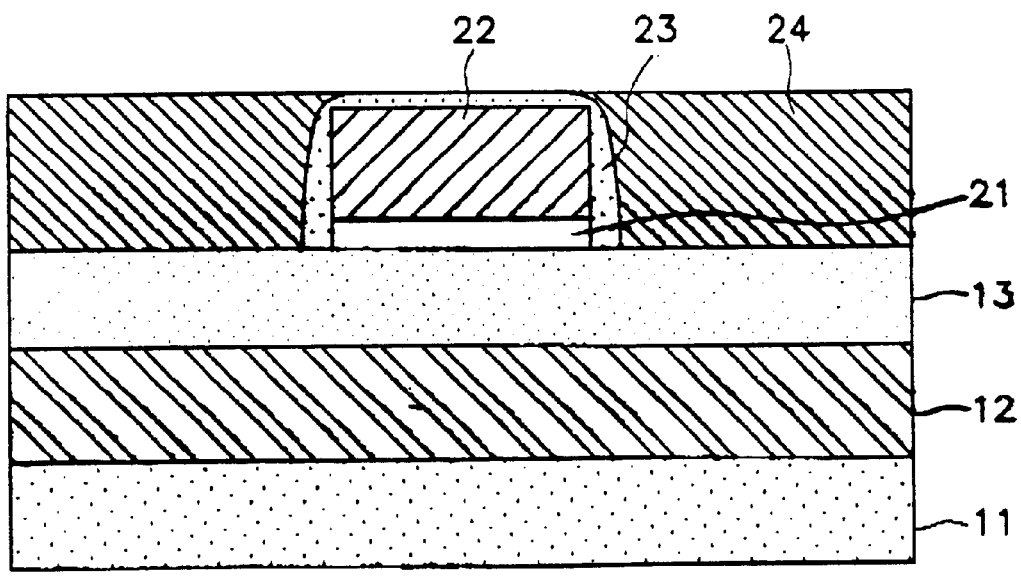

Referring to FIG. 2B, an insulating film is deposited over the gate 22 and semiconductor layer 13, and then, the insulating film is plasma etched, thereby forming a dummy spacer 23. Herein, the dummy spacer 23 is formed on the gate 22 and the side walls of the gate 22 at a predetermined thickness. A polycrystalline silicon film 24 is thickly deposited over the resultant structure, and then the polycrystalline silicon film 24 is polished through a CMP process using the dummy spacer 23 as a polishing stop layer.

Figure 2C:
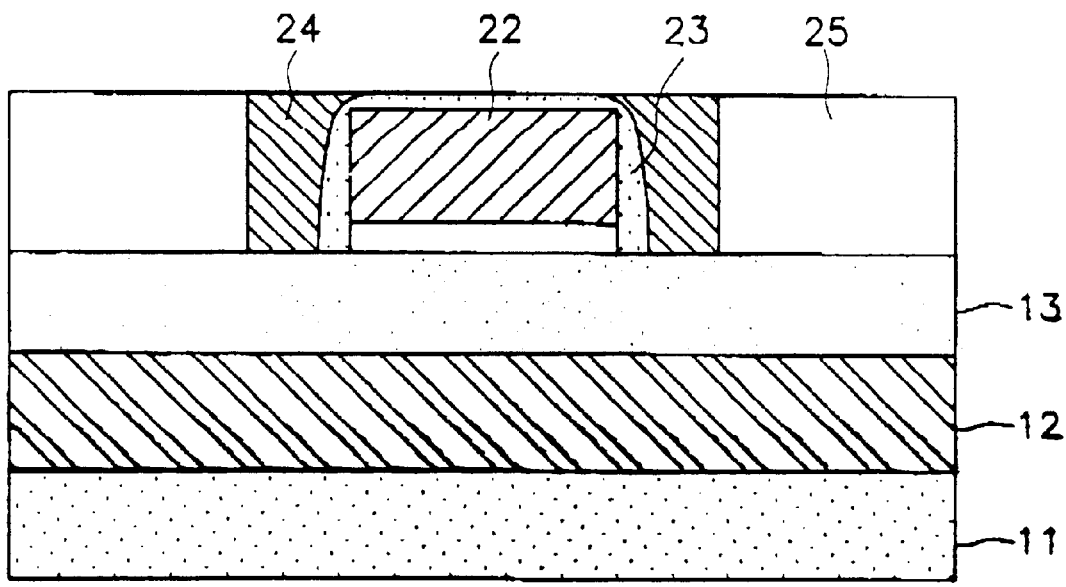

Referring to FIG. 2C, the polycrystalline silicon film 24 is etched to a predetermined thickness on both sides of gate 22 including a dummy spacer 23. An interlayer insulation film 25 is deposited over the resultant structure, and then the interlayer insulation film 25 is polished in accordance with a CMP process using the dummy spacer 23 as a polishing stop layer.

Figure 2D:
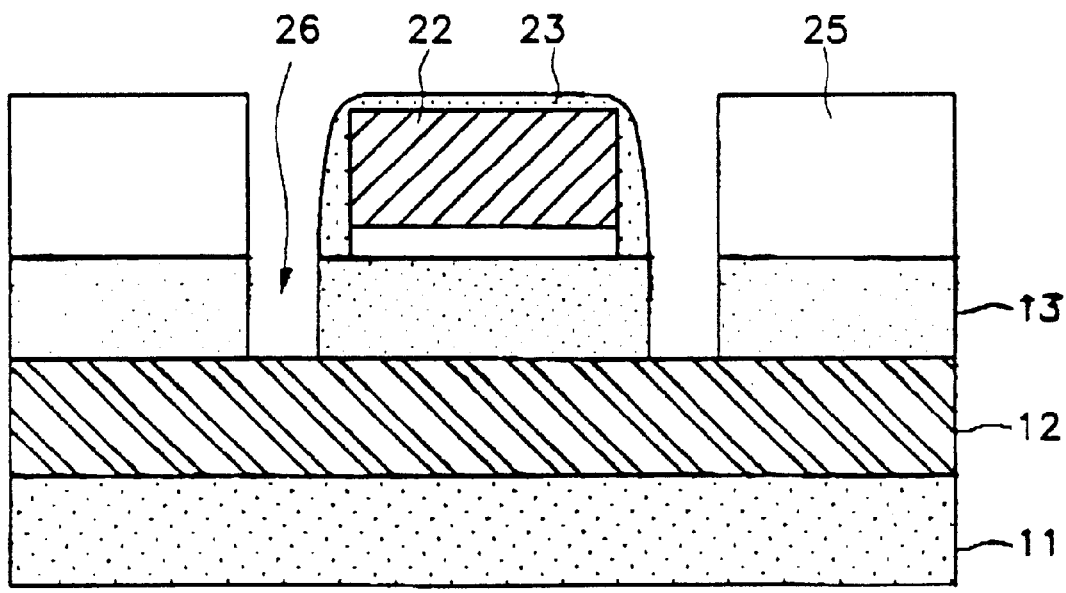

Referring to FIG. 2D, the remaining polycrystalline silicon film is removed by dry or wet etching. Afterwards, the semiconductor layer exposed by removal of the polycrystalline silicon film is dry etched, as a result holes 26 exposing the buried oxide film 12 are obtained.

Figure 2E:
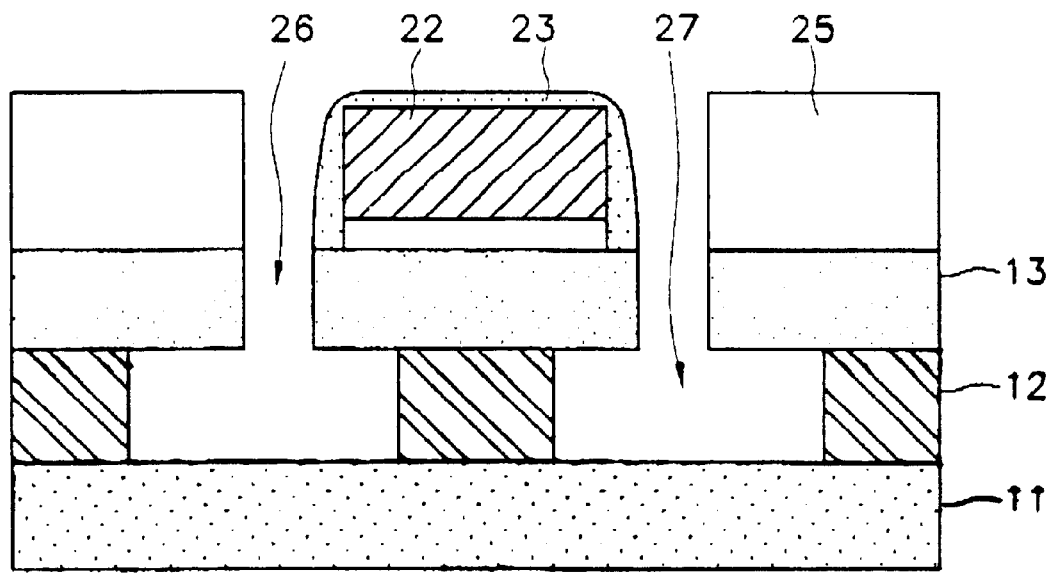

Referring to FIG. 2E, the buried oxide film exposed through the holes 26 and the area adjacent thereto are etched in accordance with a wet etching process, thereby forming vacancies 27. Here, the size of the vacancy 27 is controlled by the timing of the wet etching process on the buried oxide film 12.

Figure 2F:
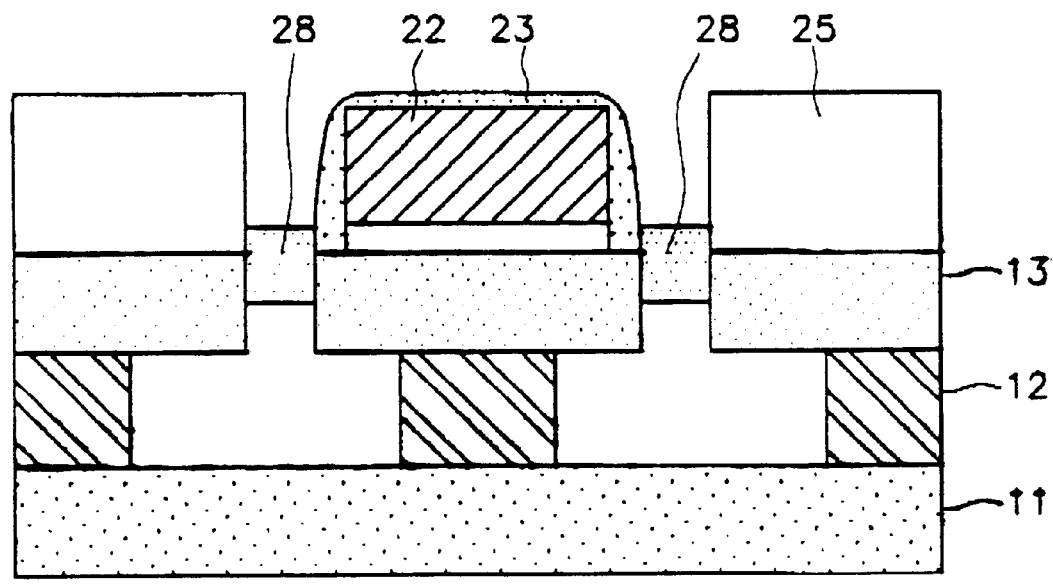

Referring to FIG. 2F, a silicon epitaxial layer 28 is grown on the exposed semiconductor layer by the selective epitaxial growth process using the semiconductor layer exposed through the holes 26 as a growth source. The silicon epitaxial layer is grown in a non-doping state and is grown from the midpoint of the semiconductor layer 13 to the point higher than the upper surface of the semiconductor layer.

Figure 2G:
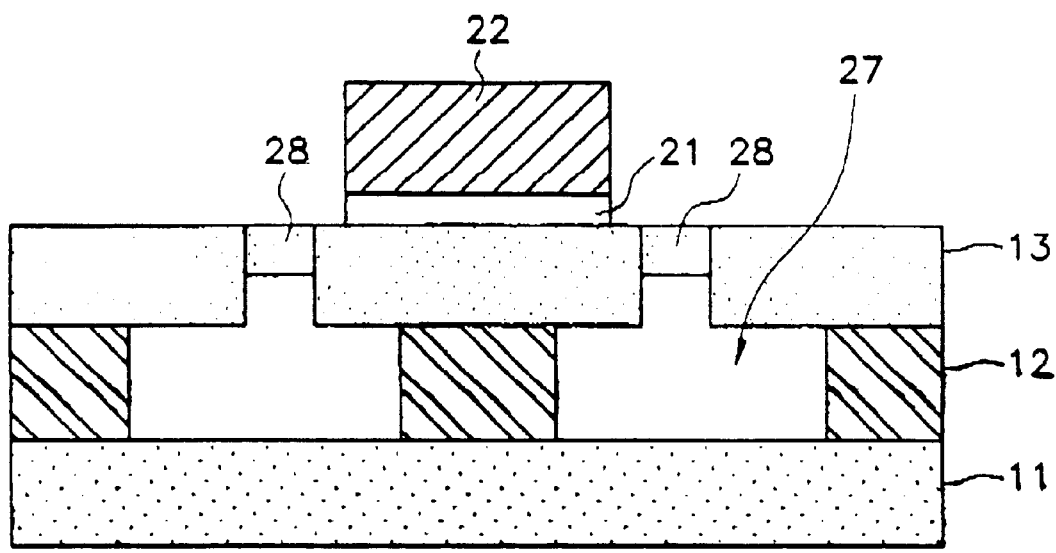

Referring to FIG. 2G, the surface of silicon epitaxial layer 28 is etched to the upper surface of the semiconductor layer 13. And then, a interlayer insulation film 25 and a dummy spacer 23 are removed.

Figure 2H:
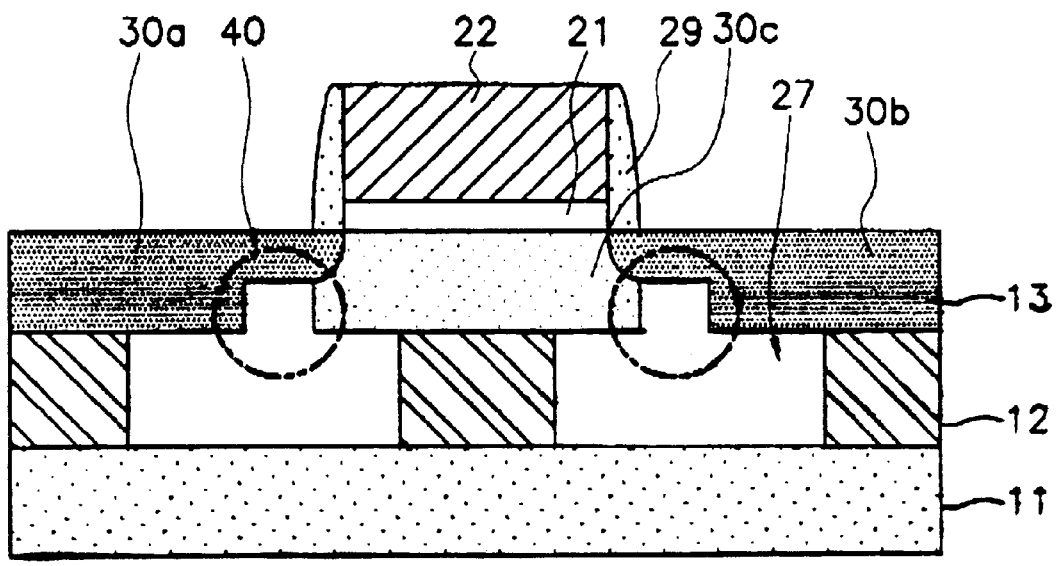

Referring to FIG. 2H, on an active region of the semiconductor layer, impurities are implanted in a low concentration. And then a gate spacer 29 is formed on both side walls of the gate 22. A source/drain regions 30a and 30b having a LDD region are formed by implanting desired impurities in a high concentration on the active region. As a result, a part depletion type SOI device according to the present invention is obtained.

In the part depletion type SOI device according to the present invention, there is a physical isolated space 40 on the neutral layers of source region 30a and drain region 30b, that is, on boundaries between the source region 30a and a channel region 30c and between the drain region 30b and the channel region 30c. Therefore, although the channel region 30c is fully isolated by the buried oxide film 12 and field oxide film (not shown), it is difficult to form PN junction between the source region 30a and channel region 30c by the holes accumulated on the neutral layer of the source region 30a.

Accordingly, the part depletion type SOI device according to the present invention is capable of preventing a parasitic bipolar transistor and a floating body effect such as a kink phenomenon. The size of physical isolation space may be controlled by the timing of the wet etching process on the buried oxide film 12.

In accordance with the present invention, a part depletion type SOI device has physical isolation spaces on the boundaries between channel region and source/drain regions, thereby preventing mis-operation due to the floating body effect. Therefore, the improved characteristic and reliability of SOI device can be obtained.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A method for fabricating SOI devices comprising:

preparing a SOI wafer having a stack structure of a base substrate, a buried oxide film, and a semiconductor layer;

forming a field oxide film on the semiconductor layer to define an active region;

forming a gate on the active region of the semiconductor layer, the gate having two side walls;

forming a dummy spacer on the gate and the two side walls;

forming a polycrystalline silicon film at a selected width on the two side walls of the gate including the dummy spacer to form a resultant structure;

depositing an insulating film on the resultant structure;

polishing the insulating film using the dummy spacer as a polishing stop layer;

removing the polycrystalline silicon film to expose a part of the semiconductor layer;

forming a hole exposing a part of the buried oxide film by dry etching the exposed part of the semiconductor layer;

etching the buried oxide film exposed through the hole and an area adjacent thereto using a wet etching process;

growing a silicon epitaxial layer from a midpoint of the semiconductor layer to a point higher than an upper surface of the semiconductor layer on a side of the part the semiconductor layer exposed by the hole using a selective epitaxial growth process;

etching a surface of the silicon epitaxial layer to be equivalent to a height of the semiconductor layer;

removing the dummy spacer and the insulating film; and forming source/drain regions of LDD structure having a first physical isolation space on a first boundary between a source region and a channel region and a second physical isolation space on a second boundary between a drain region and the channel region in the active region of the exposed semiconductor layer.

2. The method according to claim 1, wherein the step of forming the polycrystalline silicon film comprises:

depositing a polycrystalline silicon film on the semiconductor layer including a gate having dummy spacer;

polishing the polycrystalline silicon film using the dummy spacer as a polishing stop layer; and etching the polycrystalline silicon film to a predetermined thickness on the two side walls of the dummy gate.

3. The method according to claim 1, wherein the silicon epitaxial layer is grown in a non-doping state.

4. The method according to claim 1, wherein a size of the first physical isolation space and a size of the second physical isolation space are controlled by a timing of the wet etching process on the buried oxide film.

* * * * *